(12) United States Patent
   Claeys

(10) Patent No.: US 9,841,441 B2
(45) Date of Patent: *Dec. 12, 2017

(54) ELECTRICAL CURRENT TRANSDUCER

(71) Applicant: LEM Intellectual Property SA, Fribourg (CH)

(72) Inventor: Stéphane Claeys, Chevrier (FR)

(73) Assignee: LEM Intellectual Property SA, Fribourg (CH)

( * ) Notice: Subject to any disclaimer, the term of this patent is extended or adjusted under 35 U.S.C. 154(b) by 38 days.

This patent is subject to a terminal disclaimer.

(21) Appl. No.: 14/931,756

(22) Filed: Nov. 3, 2015

(65) Prior Publication Data

US 2016/0154027 A1    Jun. 2, 2016

(30) Foreign Application Priority Data

Nov. 28, 2014    (EP) .................................... 14195548

(51) Int. Cl.
   *G01R 15/18*     (2006.01)
   *H01F 27/26*     (2006.01)
   *H01F 27/30*     (2006.01)
   *H01F 27/32*     (2006.01)
   *H01F 38/30*     (2006.01)

(52) U.S. Cl.
   CPC ......... *G01R 15/183* (2013.01); *G01R 15/185* (2013.01); *H01F 27/266* (2013.01);
   (Continued)

(58) Field of Classification Search
   CPC .. G01R 15/183; G01R 15/185; G01R 15/202; G01R 15/207; G01R 15/14; G01R 15/20;
   (Continued)

(56) References Cited

U.S. PATENT DOCUMENTS 6,400,130 B2 *   6/2002   Berkcan ............... G01R 15/181
                                                                 324/117 R
9,310,400 B2 *   4/2016   Fujita ................. G01R 19/0092
                         (Continued)

FOREIGN PATENT DOCUMENTS

EP          0356171 A2     2/1990
EP          0365216 A1     4/1990
                      (Continued)

OTHER PUBLICATIONS

European Search Report issued by the European Patent Office, dated Jun. 15, 2015, for European Application No. EP14195548.4; 5 pages.

(Continued)

*Primary Examiner* — Thang Le
(74) *Attorney, Agent, or Firm* — Faegre Baker Daniels LLP

(57) ABSTRACT

Electrical current transducer including a magnetic core comprising a magnetic circuit gap, a magnetic field detector comprising a sensing portion positioned in the magnetic circuit gap, an insulating support body comprising a coil support portion and a coil terminal connection portion, and a secondary coil formed from a wire wound around the coil support portion. The coil support portion has a generally U-shaped cross-sectional profile comprising a base wall, a radially inner wall extending from the base wall and a radially outer wall extending from the base wall, the radially inner and outer walls having a height configured such that open end edges thereof extend slightly beyond an axial thickness of the magnetic core including any manufacturing tolerances such that the open end edges are folded inwards around corners of the magnetic core by the coil wound around the magnetic core housing.

15 Claims, 10 Drawing Sheets

(52) U.S. Cl.
CPC ......... *H01F 27/306* (2013.01); *H01F 27/325* (2013.01); *H01F 38/30* (2013.01); *H01F 2038/305* (2013.01)

(58) Field of Classification Search
CPC .... G01R 19/0092; G01R 13/02; G01R 21/08; G01R 11/32; G01R 33/18; G01R 33/02; H01L 41/12; H01L 41/16; H02K 41/06; H01F 27/266; H01F 27/306; H01F 27/325
USPC ........ 324/127, 117 R, 117 H, 260, 249, 109, 324/235, 244, 251, 207.12–207.13
See application file for complete search history.

(56) References Cited

U.S. PATENT DOCUMENTS

| | | | |
|---|---|---|---|
| 9,341,654 B2* | 5/2016 | Loglisci | G01R 3/00 |
| 2006/0176140 A1* | 8/2006 | Skendzic | H01F 5/003 336/225 |
| 2008/0048646 A1 | 2/2008 | Wilkerson et al. | |
| 2008/0174320 A1 | 7/2008 | Smith et al. | |
| 2011/0156697 A1 | 6/2011 | Gunn | |
| 2013/0200971 A1* | 8/2013 | Crutcher | H01F 27/24 336/90 |
| 2015/0293157 A1* | 10/2015 | Weller | G01R 19/0092 324/127 |

FOREIGN PATENT DOCUMENTS

| | | |
|---|---|---|
| EP | 0838686 A2 | 4/1998 |
| EP | 2423693 A1 | 2/2012 |
| EP | 2546660 A1 | 1/2013 |

OTHER PUBLICATIONS

European Search Report issued by the European Patent Office, dated Jun. 15, 2015, for European Application No. EP14195549.2; 6 pages.

* cited by examiner

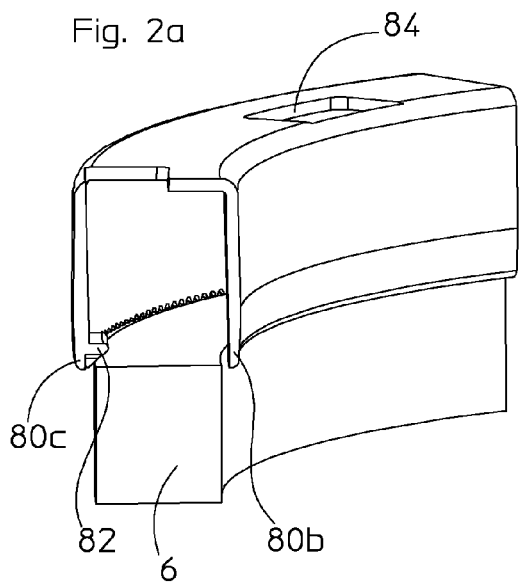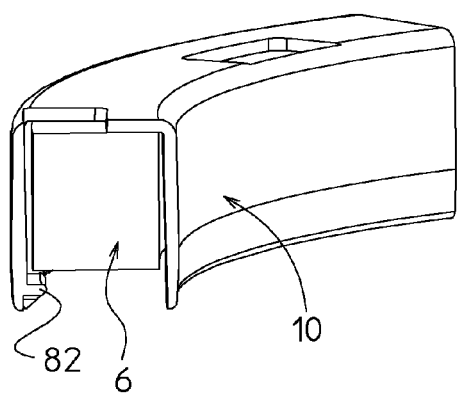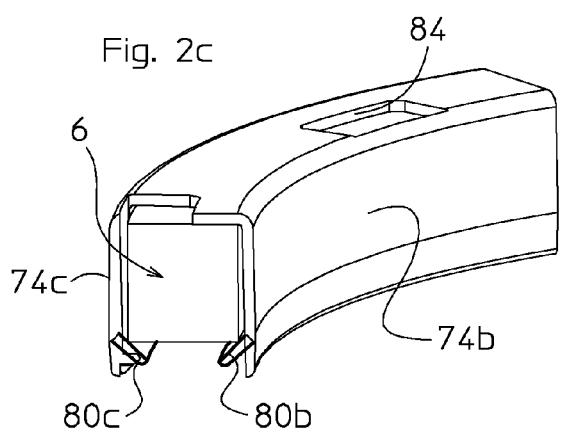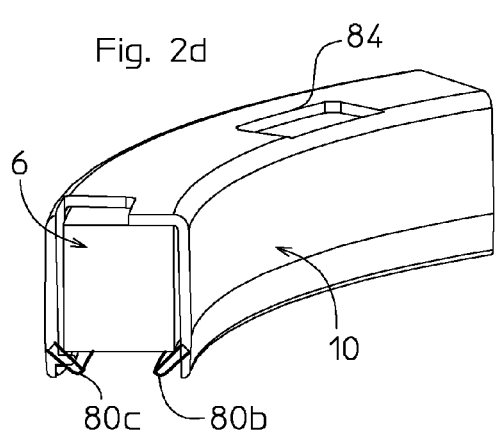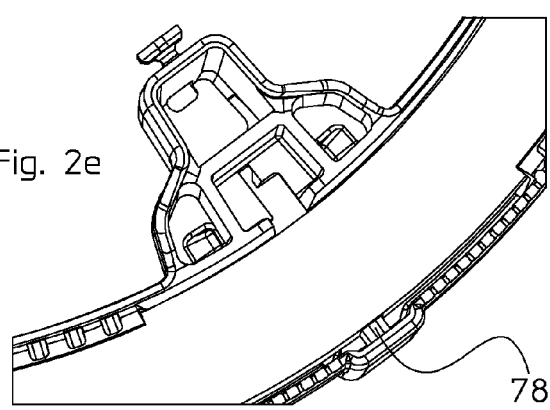

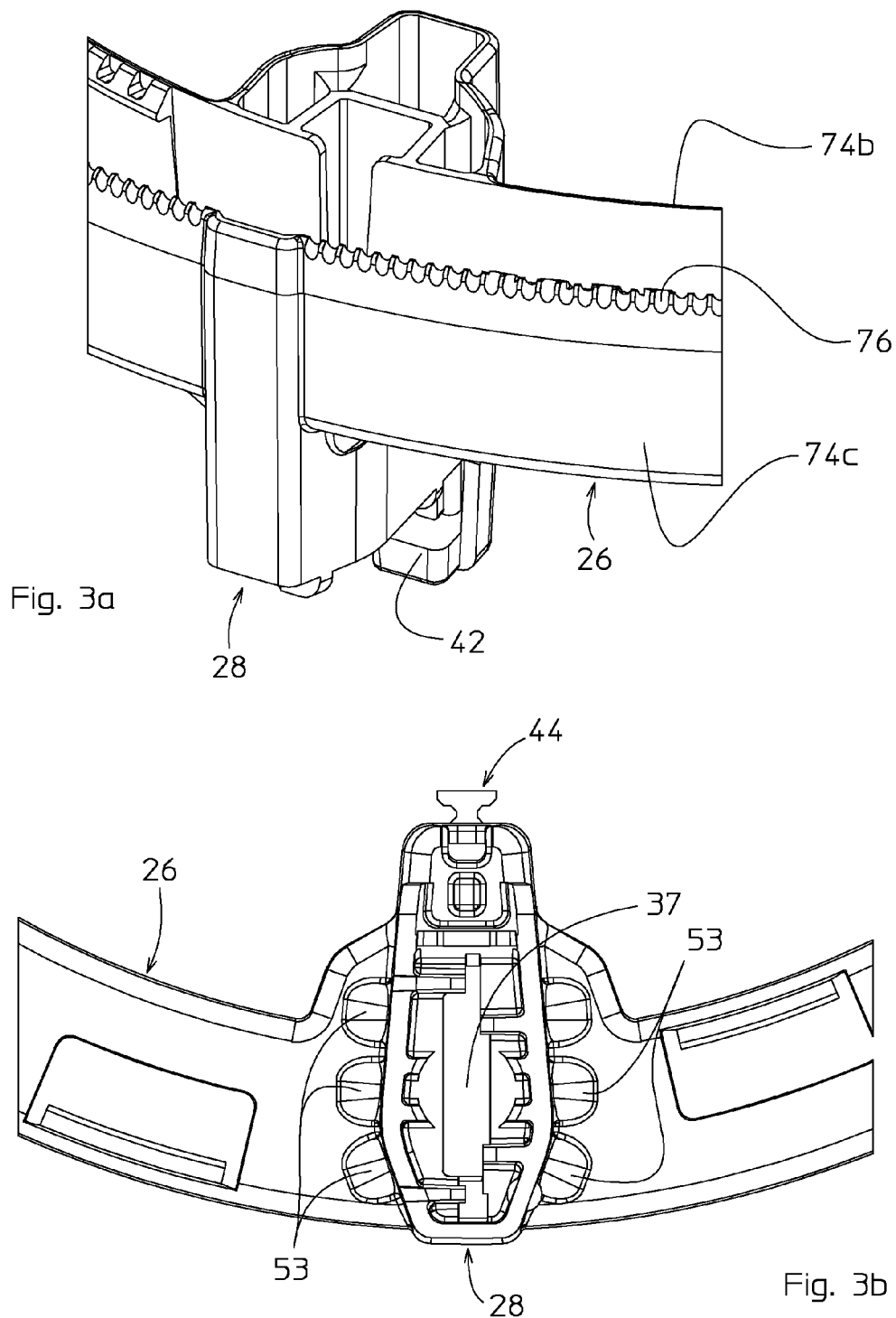

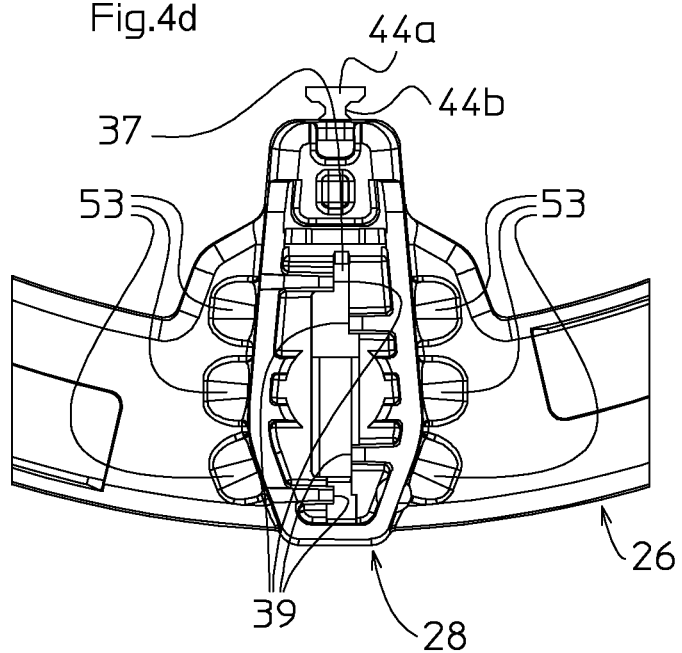
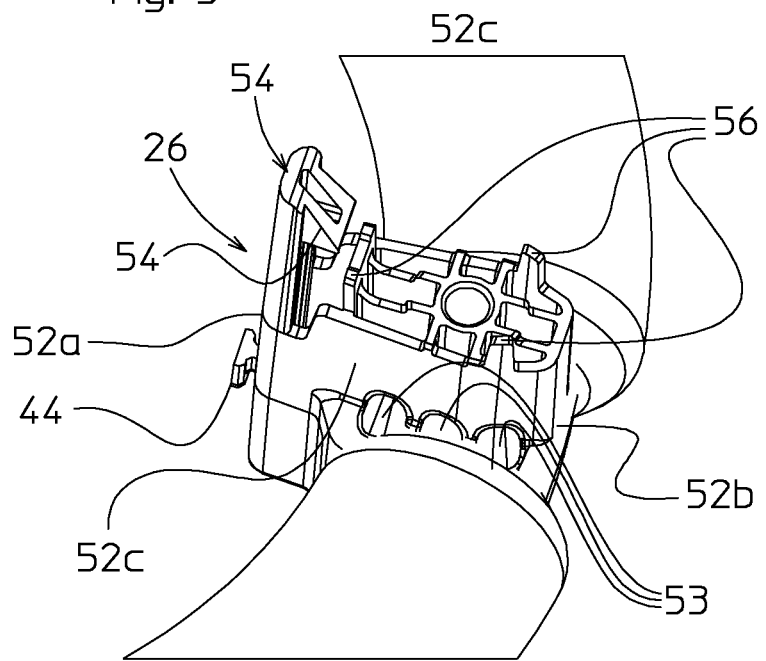

ELECTRICAL CURRENT TRANSDUCER

FIELD OF THE INVENTION

The present invention relates to an electric current transducer comprising a magnetic core and a magnetic field detector for measuring an electrical current flowing in a primary conductor extending through the magnetic core.

BACKGROUND

Electrical current transducer modules for current sensing applications typically comprise a magnetic core made of a high permeability magnetic material, surrounding a central aperture through which passes a primary conductor carrying the current to be measured. The magnetic core may typically have a generally rectangular or circular shape and be provided with an air-gap in which a magnetic field detector, such as a Hall effect sensor in the form of an ASIC, is positioned. The magnetic flux generated by the electrical current flowing in the primary conductor is concentrated by the magnetic core and passes through the air-gap. The magnetic field in the air-gap is representative of the primary current. In current transducers of the open-loop type, the magnetic field sensor in the air-gap generates an image of the current to be measured that represents the measurement signal.

In current sensors of the closed-loop type the magnetic field sensor is connected in a feed-back loop to a secondary coil that is typically wound around a portion of the magnetic core in order to generate a compensation current that tends to cancel the magnetic field generated by the primary conductor. The compensation current thus represents an image of the current to be measured. In order to decrease the current required to drive the compensation coil, it is well known to wind a large number of turns around a section or most of the circumference of the magnetic circuit.

Typically, the compensation conductor coil is wound around an insulating bobbin support that surrounds a portion or whole of the magnetic circuit along which the secondary coil extends. The insulating bobbin is typically made of two parts assembled around the magnetic core, sometimes with an adhesive tape wound therearound. The insulating bobbin protects the first layer of the coil from damage and from being short circuited by the magnetic core, in particular during the winding manufacturing process and thereafter in use due to vibration, shock or thermal dilatation effects. The need for protection is particularly important for square or rectangular cross-section profiled magnetic cores in view of the sharp corners. Conventional insulating bobbins however add to manufacturing and assembly costs. Another drawback is the additional thickness of conventional two-part insulating bobbins that increases the diameter of the windings of the coil thus increasing the weight and length of copper wire used.

One problem linked to the protection of the magnetic core is that its geometry may be quite coarse. Indeed, inner and outer diameters and height can vary in a non-negligible manner. The coil obtained after winding depends on initial core dimensions. Another problem is due to winding effect: the wire tension force is quite important and the force applied on the protection is very local (important pressure stresses on a very small contact surface between winding wire and the protection, mainly on the first winding layer). Sometimes, wire repartition around the magnetic core while winding is not homogeneous due to the fact that initial layer of wires slides on the magnetic core protection. Further, in order to minimize copper wire necessary to obtain the different coils, the number of jumps during winding should be as low as possible. Often, 3 jumps corresponding to 3 fixing points with main PCBA are used.

Fixing the circuit board and secondary coil is often done by means of screws. This method is mechanically safe but it is not cost effective (additional parts and labor costs) and is risky (screw-driving machine head near PCBA electronic components). The link between the two parts has to be strong enough to permit the mounting of the transducer. The final mechanical fixing is in fact ensured by potting resin.

Positional accuracy of certain components in the transducer over its lifetime usage is also important to ensure reliability and measurement accuracy. In particular, the magnetic field detector should be precisely referenced into the magnetic core air gap in order to obtain good measuring head performance level. A further problem encountered in conventional transducers is that electrostatic screens are floating and badly referenced before potting process in the transducers.

Electrical current sensors are used in a large variety of applications for monitoring or controlling electrical devices and system and in many applications there is an important advantage in reducing the manufacturing cost of such components and also the costs of implementing and using the components in an electrical circuit. There is often also an important advantage in providing compact components in order to miniaturize and/or reduce the weight of the devices in which the components are mounted.

SUMMARY

An object of the invention is to provide an electrical current transducer that is compact and economical, in particular that is economical to produce and assemble.

It is advantageous to provide an electrical current transducer that is accurate, easy to implement and economical to use.

It is advantageous to provide an electrical current transducer that is robust and stable.

Disclosed herein is an electrical current transducer including a magnetic core comprising a magnetic circuit gap, a magnetic field detector comprising a sensing portion positioned in the magnetic circuit gap, a magnetic core housing comprising a coil support portion and a coil terminal connection portion, and a secondary coil formed from a wire wound around the coil support portion. The coil support portion has a generally U-shaped cross-sectional profile comprising a base wall, a radially inner wall extending from the base wall and a radially outer wall extending from the base wall. The radially inner and outer walls have a height configured such that open end edges thereof extend slightly beyond an axial thickness of the magnetic core including any manufacturing tolerances, such that the open end edges are folded inwards around corners of the magnetic core by the coil wound around the magnetic core housing.

In an embodiment, the coil support portion may advantageously comprise core latching elements in the form of latching shoulders configured to allow the core to be axially inserted in the core housing and to hold the core within the core housing during assembly.

In an embodiment, the base wall may advantageously comprise orifices configured for forming the latch elements in an injection molding die tool.

In an embodiment, the core housing may further comprise at least one circuit board support portion mounted to the coil support portion, configured to provide a support leg for mounting of the magnetic core and secondary coil on a circuit board.

In an embodiment, the coil support portion of the core housing may advantageously comprise wire anti-slip elements configured to prevent slipping of a first winding layer of the secondary coil on the core housing during the winding process.

In an embodiment, the wire anti-slip elements comprise indents formed on an open end edge of the radially outer wall and/or radially inner wall.

In an embodiment, the coil terminal connection portion may comprise a housing portion comprising a radially inner wall portion, a radially outer wall portion, a coil side wall portion and a coil side wall portion, the coil side wall portions comprising deflector ribs arranged in a corner joining the side wall portions to the base wall, the deflector ribs configured to avoid a build-up of winding turns adjacent the side wall portions.

In an embodiment, the coil terminal connection portion may comprise a magnetic sensor receiving cavity for lodging the magnetic field detector therein.

In an embodiment, the coil terminal connection portion may comprise a circuit board resting edge and a circuit board latching element that extends over an edge of the circuit board to secure the magnetic core, core housing and secondary winding assembly to the circuit board.

In an embodiment, the coil terminal connection portion may comprise a first wire securing slot in the housing receiving a first connection end of a wire forming the secondary coil, and a second wire securing slot receiving a second connection end of the wire.

In an embodiment, the core housing may further comprise at least one circuit board support portion connected to the coil support portion, the circuit board support portion comprising a circuit board resting edge and a circuit board latching element configured to extend over an edge of a circuit board to secure the magnetic core, core housing and secondary winding to the circuit board.

In an embodiment, there may be only one circuit board support portion, the circuit board support portion positioned opposite the coil terminal connection portion such that a mounting support of the core and secondary winding is substantially balanced. The circuit board support portion and coil terminal connection portion thus form two supports for the secondary winding and magnetic core on the circuit board, the low number of supports reducing the number of interruptions of the secondary winding along the core, thus providing a longer winding and reducing manufacturing costs related to performing the jumps over and across the supports to join the winding sections together.

In an embodiment, the circuit board support portion may comprise a housing portion comprising a radially inner wall portion, a radially outer wall portion, and coil side wall portion, the side wall portions comprising deflector ribs arranged in a corner joining the side wall portions to the base wall, the deflector ribs configured to avoid a build-up of winding turns adjacent the side wall portions.

In an embodiment, the core housing may further comprise screen fixing protrusions configured to position and hold an electrostatic shield to the core housing during manufacturing assembly.

In an embodiment, the core housing may advantageously be in the form of a single molded part.

Further objects and advantageous features of the invention will be apparent from the claims, from the detailed description, and annexed drawings.

BRIEF DESCRIPTION OF THE DRAWINGS

FIGS. 2a to 2d are respective sectional views of a core housing and magnetic core of an electrical current transducer according to an embodiment of this invention illustrating assembly steps;

FIG. 2e is a perspective view of a portion of the core housing and magnetic core;

FIGS. 3a and 3b are detail views of a portion of the core housing;

FIGS. 4a to 4d are detailed perspective views (4a-4c) and a plan view (4d) illustrating a coil terminal connection portion of the core housing according to an embodiment of this invention;

FIG. 5 is a detailed perspective view of a circuit board support portion of the core housing according to an embodiment of this invention;

FIG. 7b is a perspective detailed view of a portion of the current transducer of FIG. 7a;

FIG. 9a is a perspective view of a casing base part and electrostatic shield of an electrical current transducer according to an embodiment of this invention;

FIG. 9b is a perspective cross-sectional view of a portion of the casing base part and electrostatic shield of FIG. 9a;

DETAILED DESCRIPTION OF EMBODIMENTS

Figure 1A:
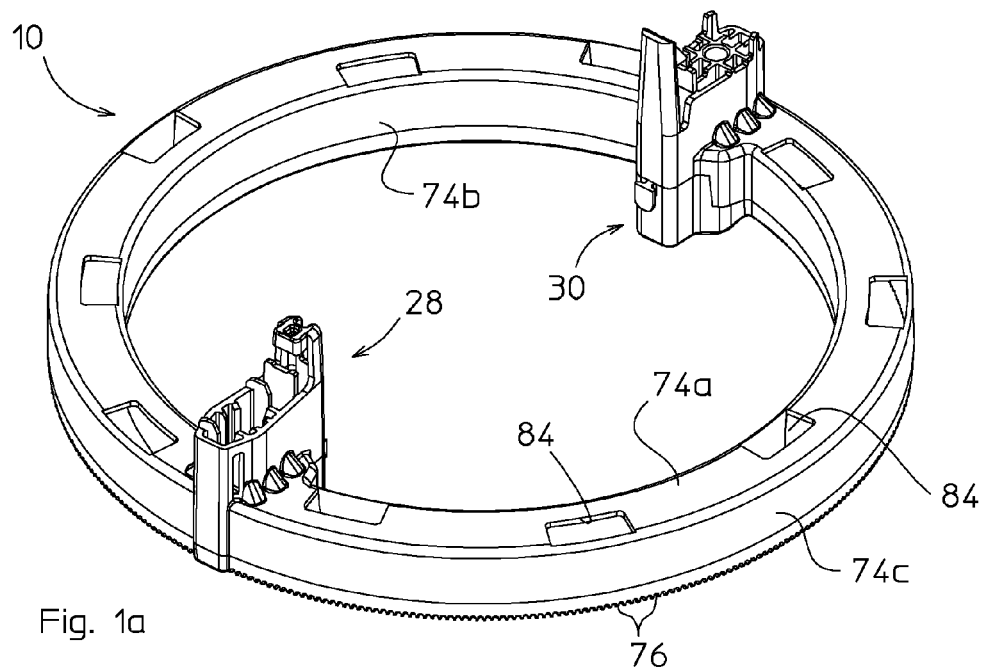
FIGS. 1a and 1b are perspective views of a core housing of an electrical current transducer according to an embodiment of this invention.
Figure 1B:
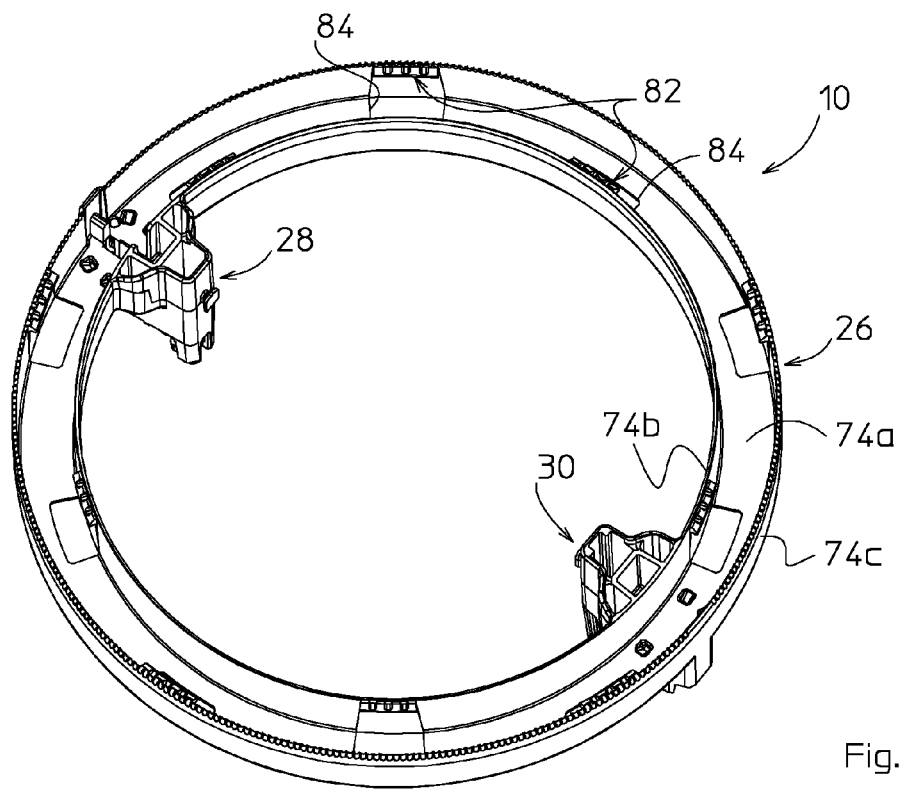
Figure 4A:
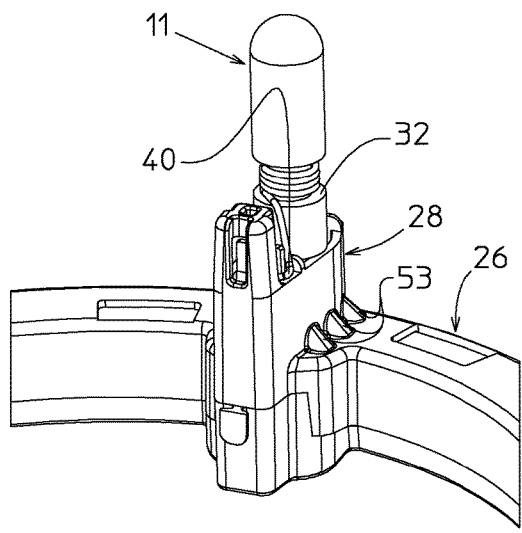
Figure 4B:
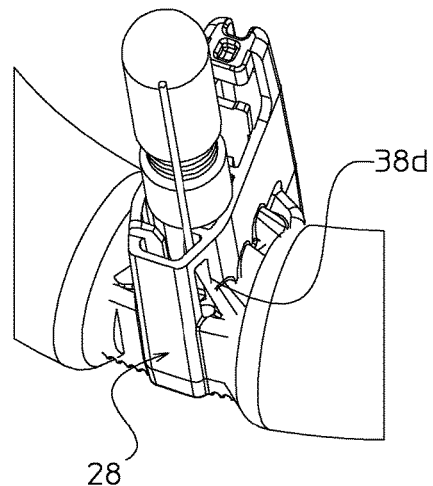
Figure 4C:
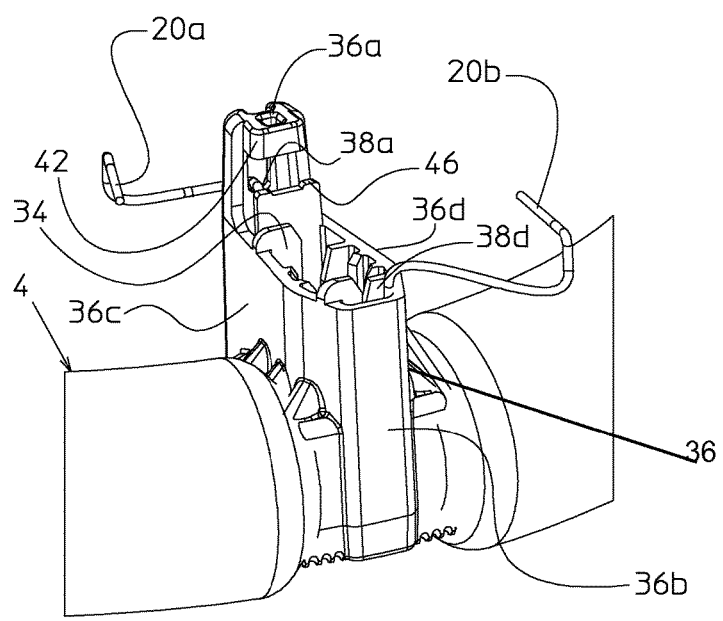

Referring to the figures, an exemplary embodiment of an electrical current transducer 2 comprises an outer casing 3 comprising a base part 5 and a cover part 7, and mounted therein: a core housing 10, a magnetic core 6 mounted in the core housing 10, a secondary coil 4 mounted around the core housing and magnetic core, a magnetic field detector 8 inserted in a magnetic circuit gap of the magnetic core, and a circuit board 12 on which the core housing, magnetic core and secondary coil are mounted. Depending on the variant, the current transducer may further comprise an electrostatic shield 14 to protect the magnetic core and secondary coil from high voltages in a primary conductor (not shown) carrying the current to be measured. The components mounted in the casing may be surrounded by a potting material filled in the casing after assembly of the components therein. The filling of a dielectric potting material in a current transducer is per se well known in the art.

The magnetic field detector 8 may be in the form of an ASIC (Application Specific Integrated Circuit) comprising electrical terminals 16 for connection to electrical circuitry that supply power and process the measurement signals from the magnetic field detector. The magnetic field detector may be in the form of a Hall effect sensor, as is per se well known in the art, or may be based on other magnetic field sensing technologies such as magneto-resistive or fluxgate sensors that are also well known in the art.

As is per se well known in the art, the secondary coil acts as a compensation coil that is supplied with electrical current in a feedback loop connected to the magnetic field detector 8 that seeks to cancel the magnetic field generated by a primary conductor carrying the current to be measured, the primary conductor extending through a central passage 22 of the magnetic core 6. The magnetic field generated by the primary conductor circulates in the magnetic core 6 and is picked up by the magnetic field detector 8 positioned in the magnetic circuit gap 24 of the magnetic core.

The number of turns of the secondary coil is determined principally by the amplitude of the current to be measured in the primary conductor and the level of feedback current in the compensation coil that is desired. In order to reduce the amount of material used for the compensation coil, it is advantageous to have a tight, regular, compact winding with the smallest possible starting diameter. The starting diameter depends on the cross-sectional area of the magnetic core which is determined inter alia by the current measuring range, and by the thickness of the core housing surrounding the magnetic core.

Certain magnetic cores are made by winding a strip of magnetic material to form a wound magnetic core which is particularly cost effective to produce. Such wound cores however have sharp edges and may have somewhat variable diameters and/or heights. It is thus advantageous to have a core housing 10 that can adjust for the tolerances in manufacturing of such magnetic cores, the core housing main function being to provide a protective insulating layer for the wire wound around the magnetic core.

The magnetic core may also be made of a ferrite material, per se well known in the art, or of other materials such as stacked laminated sheets of magnetic material that are also per se well known in the art.

Connection ends 20a, 20b of the secondary coil 4 are connected to electronic circuitry of the current transducer mounted on the circuit board 12 via wire end connection pads 60a, 60b to which the connection ends are soldered. Other known connection means between the coil and the electronic circuitry may be employed including welding, crimping, insulation displacement, clamping connection and the like. The circuit board 12 further comprises magnetic sensor connection pads 62 for connection of the magnetic field detector to the electronic circuitry of the current transducer and further comprises connection for grounding of the magnetic core and for grounding of the electrostatic shield 14.

The circuit board 12 is provided with a central orifice aligned with the central passage 22 of the magnetic core in order to allow a primary conductor to extend therethrough. An edge of the circuit board defining the central orifice 70 comprises a support portion latch edge profile 68 and a connection portion latch edge profile 66 for connection of the core housing 10 to the circuit board as will be described in more detail further on. The circuit board may further comprise a wire end guide notch 72 used to guide the connection ends of the secondary coil for positioning the connection ends on the wire end connection pads 60a, 60b.

The circuit board may further comprise a magnetic sensor receiving slot 64 to allow assembly of the magnetic sensor therethrough into the magnetic circuit gap 24 of the magnetic core. The circuit board may further comprise connection pads 74 for connection to terminals of a connector and various electrical and electronic components (not shown) for filtering or processing the measurement signal and supply power to the magnetic field detector 8.

The core housing 10 comprises a coil support portion 26 and a coil terminal connection portion 28. The coil support portion comprising a generally U shaped profile comprising a base wall 74a, a radially inner wall 74b and a radially outer wall 74c. The core housing 10 may advantageously be an integrally formed part, for instance an injection molded single piece plastic part. The radially inner wall 74b and radially outer wall 74c may advantageously comprise core latching elements 82 in the form of latching shoulders that hold the core within the housing by axially inserting and clipping the core into the housing during assembly. The base wall 74a may advantageously be provided with orifices 84 configured for forming the latch elements in a simple injection molding die tool to avoid the use of moving injector pins or parts within the die tool thus allowing a particularly cost effective manufacturing of the core housing.

The inner and outer walls 74b, 74c have a height configured such that the open end edges 80b, 80c thereof extend slightly beyond the thickness of the magnetic core 6 including any manufacturing tolerances such that when the coil is wound around the magnetic core housing, the open end edges 80b, 80c are folded inwards around the corners of the magnetic core. This configuration advantageously allows the magnetic core housing to be formed of a single molded part in a simple economical molding process while nevertheless providing the important function of protecting the wire from damage around the corners of the magnetic core. The open ended single piece core housing is also advantageous in that it allows very simple axial assembly of the magnetic core within the housing, whereby the latching elements hold the two parts together prior to the winding operation.

The core housing may further advantageously comprise wire anti-slip elements 76 to position accurately the first winding layer of the coil on the magnetic core housing and to prevent slipping of the coil during the winding process on the core housing that could lead to irregular and thus non optimal winding. Once the first layer of wire has been wound it forms a natural anti-slip layer, as does each successive layer. The tight regular winding of the first layer thus ensures that a compact winding is achieved. In a preferred embodiment, the wire anti-slip elements are provided on the open end edge 80c of the radially outer wall 74c and/or on the open end edge 80b of the radially inner wall. In variants, the wire anti-slip elements may alternatively or additionally be provided on a corner joining the base wall 74a with the radially outer wall 74c and/or the radially inner wall 74b. The anti-slips elements may be in the form of indents, which may be configured for the diameter of the wire to be wound around the core.

The coil terminal connection portion 28 comprises a housing portion defining a magnetic sensor receiving cavity 37. The housing portion comprises a radially inner wall portion 36a, a radially outer wall portion 36b, a coil side wall portion 36c and a coil side wall portion 66d.

The housing portion 36 may further comprise a pin holder cavity 34 to receive a pin tool 11 of a winding machine therein during the coil winding process. The pin tool 11 may be provided with a wire wrap channel 32 to anchor the starting end of the wire during the coil winding process. The coil terminal connection portion may further comprise a wire guide channel 40 to receive an end of the secondary coil wire therethrough for positioning and securing the wire end during the winding process. The housing portion 36 defines a circuit board resting edge 46 and a circuit board latching element 42 that extends over an edge of the circuit board to secure the magnetic core, core housing and winding assembly to the circuit board. The circuit board latching element may advantageously be provided as an extension of the radially inner wall portion 36*a*. A wire securing slot 38*a* in the housing portion 36 receives the connection end 20*a* therethrough which defines the wire starting end in the coil forming process, and once the coil has been fully formed the finishing end of the winding corresponding to connection end 20*b* is inserted through the wire securing slot 38*d* in the coil side wall portion 36*d*.

The side wall portions 36*c*, 36*d* may further comprise deflector ribs 53 arranged in a corner joining the side wall portions to the base wall 74*a*, the function of the deflector ribs 53 being to avoid a build-up of windings adjacent the side wall portions thus ensuring a more uniform winding of the coil adjacent the side wall portions.

Figure 6A:
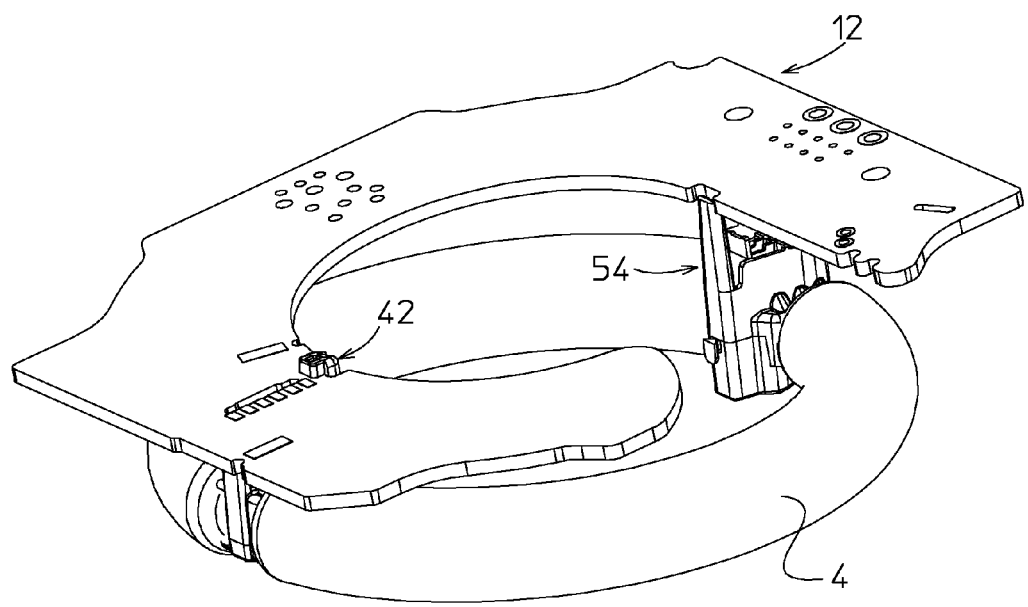
FIGS. 6a and 6b are perspective views of an electrical current transducer, with an outer housing removed, according to an embodiment of this invention.
Figure 6B:
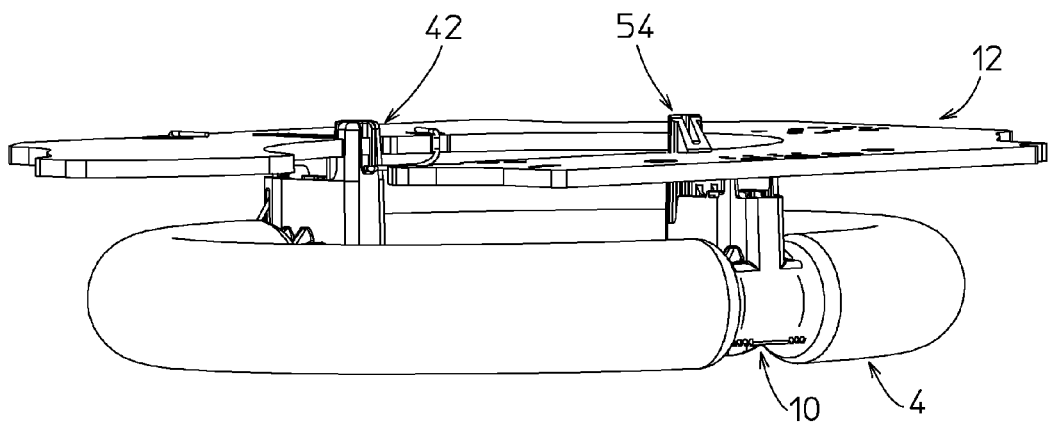
Figure 6C:
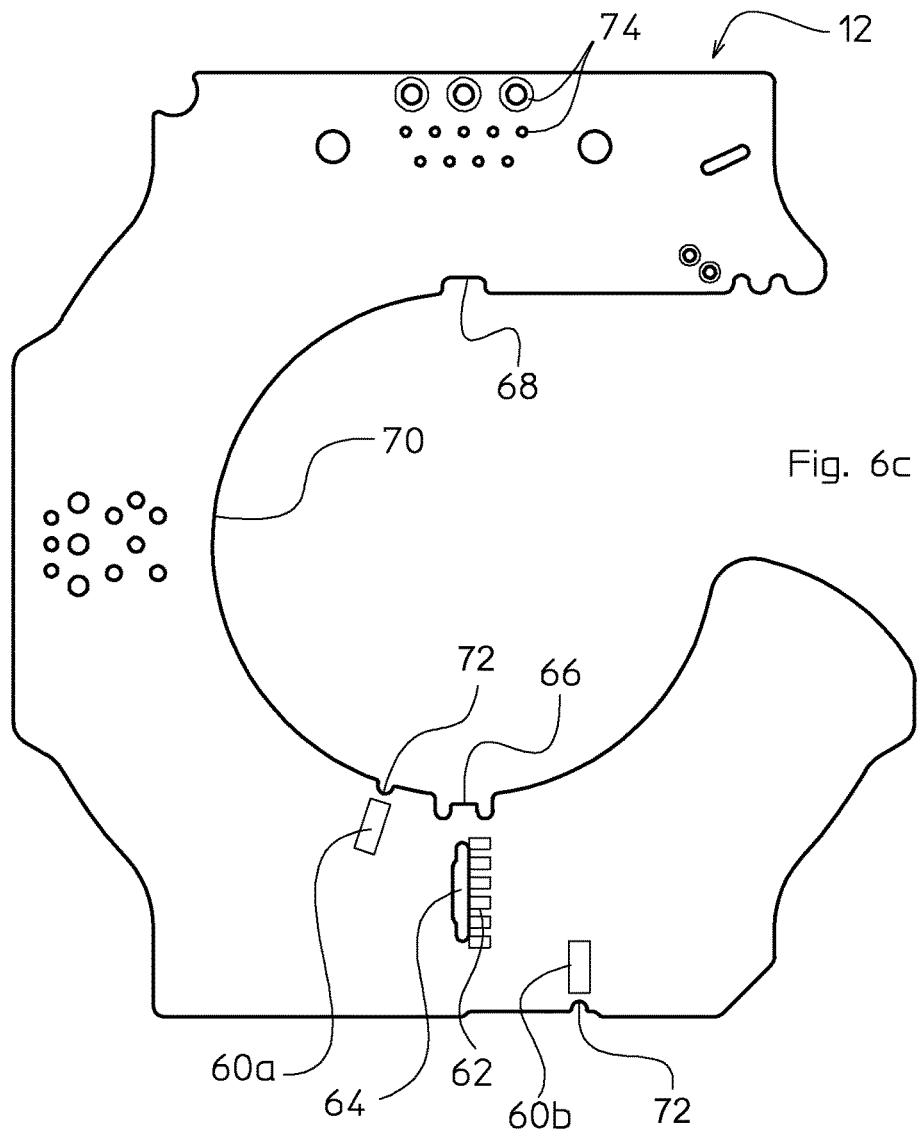
FIG. 6c is a view of a circuit board of the current transducer of FIGS. 6a, 6b.
Figure 6D:
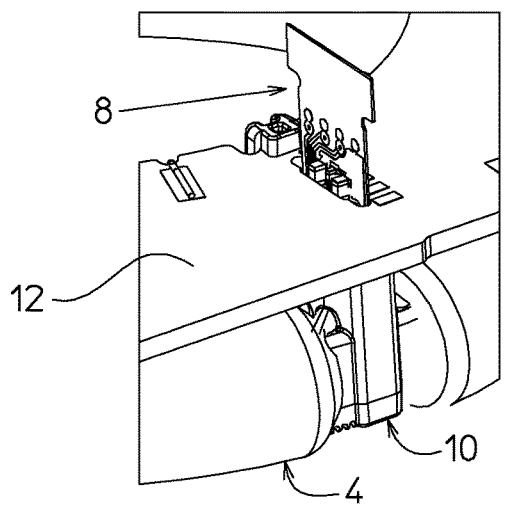
FIG. 6d is a detailed perspective view of a portion of the current transducer of FIG. 6a showing assembly of a magnetic field detector.
Figure 7A:
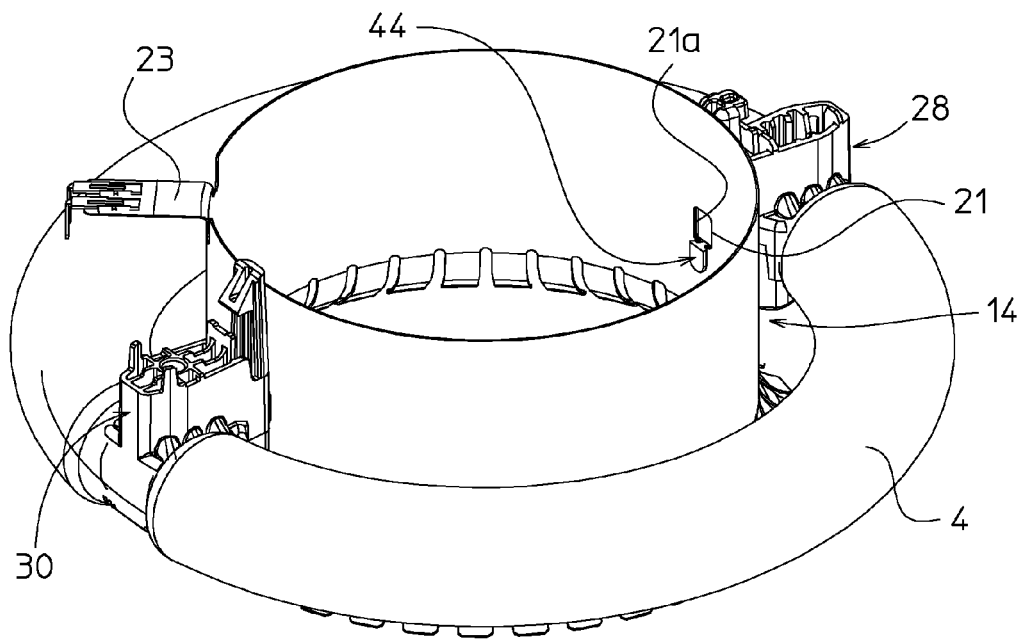
FIG. 7a is a perspective view of an electrical current transducer with electrostatic shielding according to an embodiment of this invention, shown without housing.
Figure 7B:
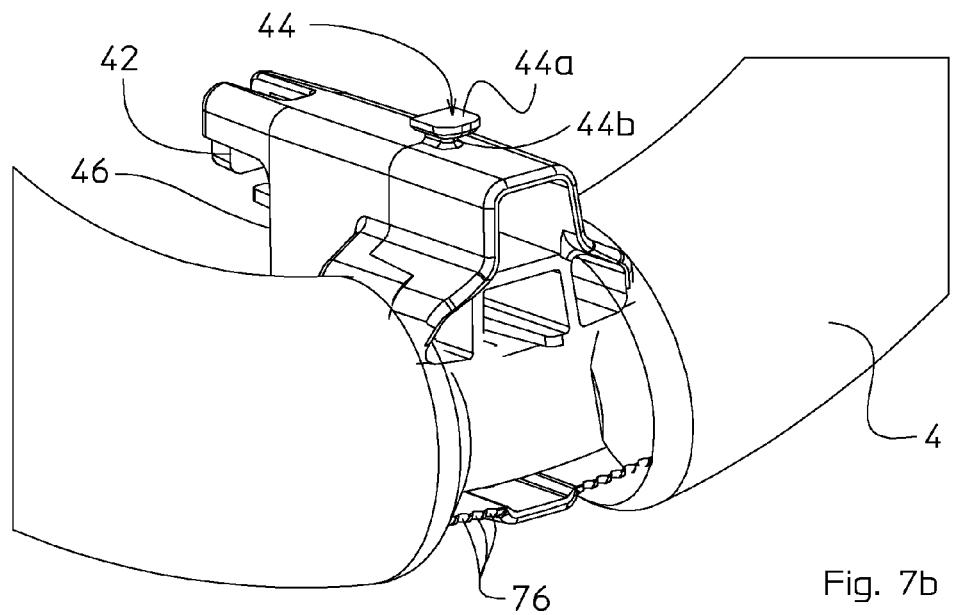
Figure 8A:
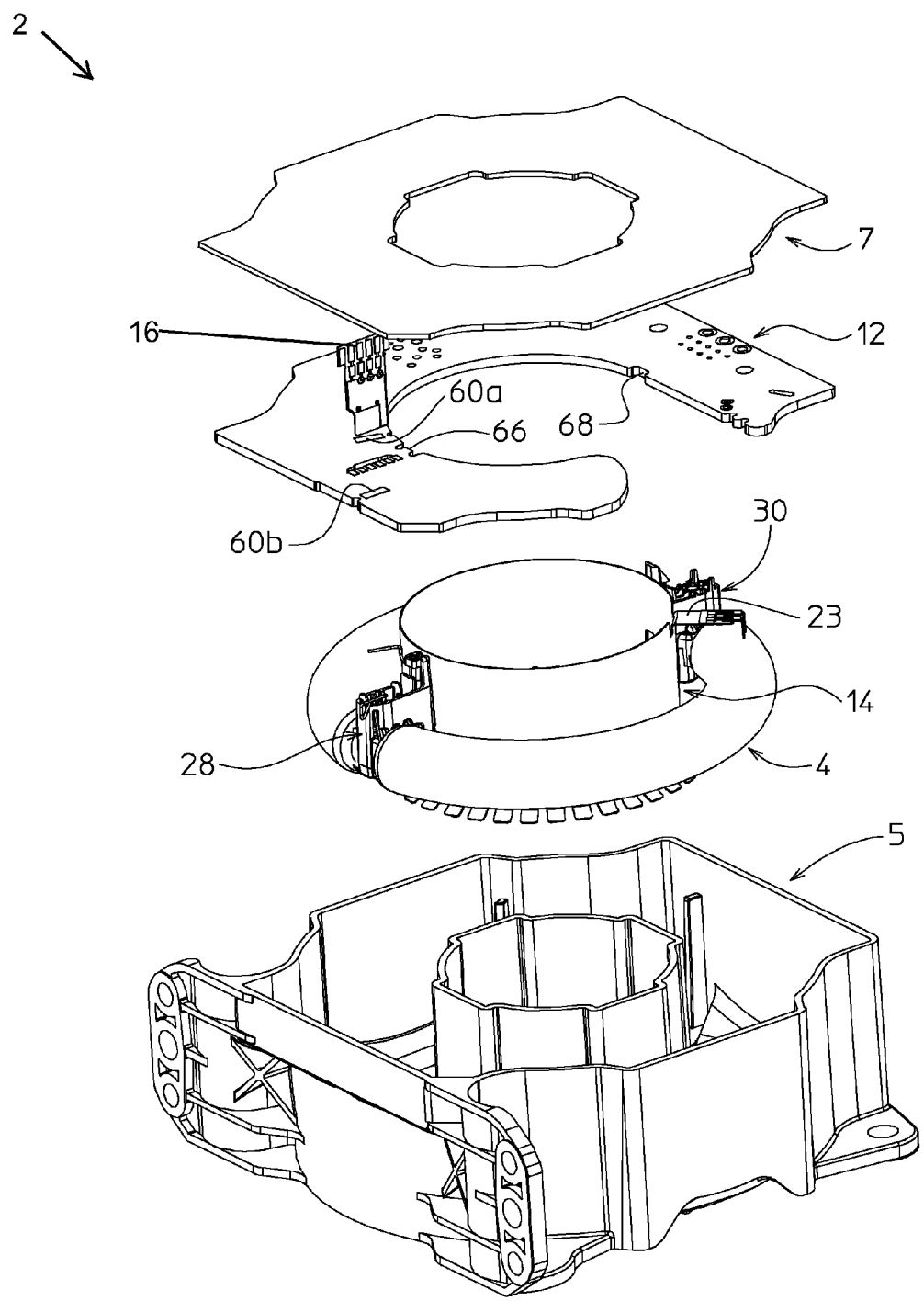
FIG. 8a is an exploded perspective view of an electrical current transducer according to an embodiment of this invention.
Figure 8B:
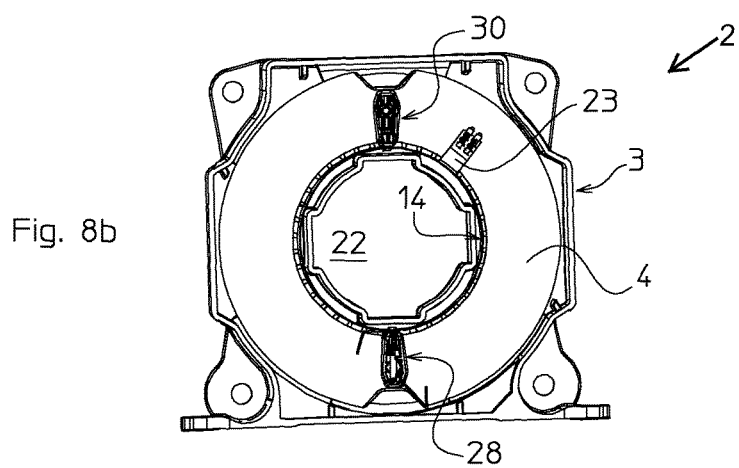
FIG. 8b is a top view of the transducer of FIG. 8a with a cover and circuit board removed.
Figures 9A, 9B:
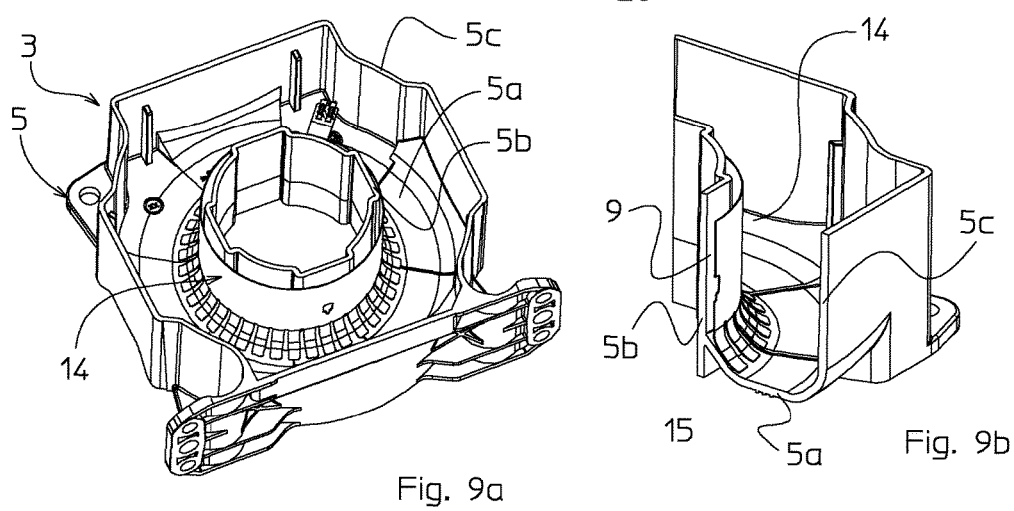
Figure 10:
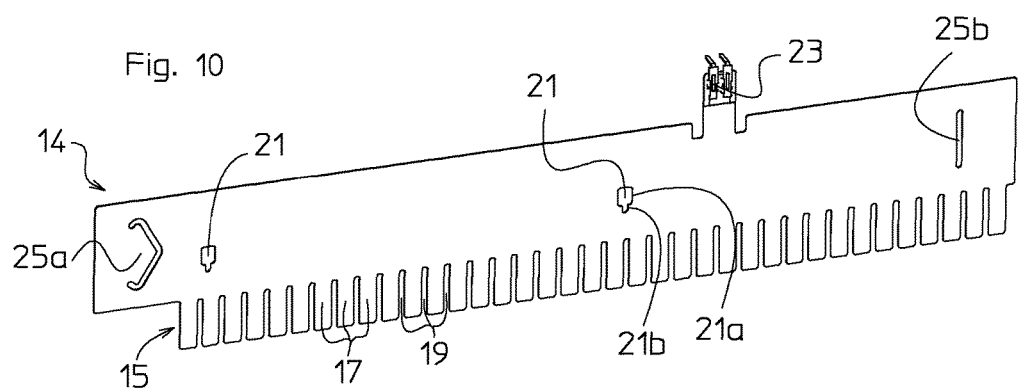
FIG. 10 is a perspective view of an embodiment of an electrostatic shield, prior to bending, of an electrical current transducer according to an embodiment of this invention.

In an embodiment, the magnetic sensor receiving cavity 37 is aligned with a magnetic sensor receiving slot 64 in the circuit board 12 to allow the magnetic field detector 8 to be assembled to the circuit board and into the air gap of the core after the circuit board has been assembled to the magnetic core and winding assembly (see FIG. 6*d*). In a variant, the magnetic field detector 8 may be pre-assembled to the circuit board prior to assembly of the circuit board 12 to the magnetic core and winding assembly 4, 6, 10. The magnetic sensor receiving cavity 37 may comprise guide rails 39 configured to guide insertion of the magnetic field detector and provide snug fitting of the detector in the cavity.

The core housing may further advantageously comprise at least one circuit board support portion 30 mounted to the coil support portion 26, configured to provide a support leg for mounting of the core and winding assembly 4, 6, 10 to the circuit board. In a preferred embodiment, the circuit board support portion 30 is positioned opposite or approximately opposite the coil terminal connection portion 28 such that the mounting support of the core and winding assembly is substantially balanced. The circuit board support portion 30 comprises a housing portion comprising a radially inner wall portion 52*a*, a radially outer wall portion 52*b*, coil side wall portions 52*c*, and circuit board positioning protrusions 56.

The housing portion defines a circuit board resting edge 46 and a circuit board latching element 54 that extends over an edge of the circuit board to secure the magnetic core, core housing and winding assembly 4, 6, 10 to the circuit board 12. The circuit board latching element 54 may advantageously be provided as an extension of the radially inner wall portion 52*a*. In a preferred embodiment, at least one of the latching elements 42, 54 is elastically mounted, for instance in the form of a cantilever arm with a latching shoulder at the free end thereof, configured to enable the circuit board 12 to be clipped to the core housing 10.

The side wall portions 36*c*, 36*d* may further comprise deflector ribs 53 arranged in a corner joining the side wall portions 52*c* to the base wall 74*a*, the function of the deflector ribs 53 being to avoid a build-up of windings adjacent the side wall portions thus ensuring a more uniform winding of the coil adjacent the side wall portions.

The core housing 10 may further comprise screen fixing protrusions 44 configured to position and hold the electrostatic shield 14 to the core housing 10, in particular during manufacturing assembly of the components of the current transducer to improve positioning of the shield and simplify assembly operations. The screen fixing protrusions 44 may advantageously be provided on the radially inner wall portions 36*a*, 52*a* of the coil terminal connection and circuit board support portions 28, 30.

The electrostatic shield may advantageously be formed from a thin flexible sheet, for instance stamped sheet metal, or a metallized flexible substrate, that may be folded into a closed shape configured to conform to the shape of the central passage 22 of the magnetic core or central orifice 70 of the circuit board. The electrostatic shield may comprise a securing mechanism, for instance in the form of a tab 25*a* and slit 25*b* configured to hold the shield in a closed bent configuration prior to locking on to the core housing. The electrostatic shield may however, in variants, be held in the bent closed position by other mechanical means or by welding, adhesive bonding, or soldering.

The electrostatic shield 14 provides an electrical shielding between the primary conductor (not shown) carrying the current to be measured and the core and coil assembly. The electrostatic shield 14 may advantageously comprise a skirt portion 15 formed by a plurality of flexible cantilever strips 17 separated by slits 19 extending axially from an edge of the shield, the cantilever strips distributed around the circumference of the shield. The cantilever sections may be bent out of the axial direction A into a curved shape to form flexible spring strips that bias against a base wall portion 5*a* of the outer casing 3 of the transducer. The main portion of the shield 14 is positioned adjacent a radially inner wall portion 5*b* of the outer casing 3. The flexible strips 17, in conjunction with the slits 19, allow potting material injected into the casing 3 to flow between the electrostatic shield 14 and the casing, in particular between the shield and the radially inner wall portion 5*b* of the casing. In a variant, the shield may be provided with flow orifices (not shown), as an alternative, or in addition to the flexible strips, to allow potting material to effectively fill in the gap between the electrostatic shield 14 and the casing radially inner wall portion 5*b*.

The electrostatic shield may advantageously comprise locking orifices 21, for instance in the form of key-hole shaped orifices having a wide portion 21*a* and a narrow portion 21*b*. In this exemplary embodiment, the key-hole shaped orifices are configured to allow the screen fixing protrusions 44, which may for instance be provided with a substantially "T" shaped profile having a wide head portion 44*a* and narrow stem portion 44*b*, to insert through the wide portion 21*a* of the key-hole shaped orifice and slide such that the stem portion 44*b* slides into the narrow portion 21*b* of the key-hole and locks the shield to the core housing. The narrow portion 21*b* is advantageously oriented towards the skirt portion 15 relative to the wide portion 21*a*, such that the spring biasing force acting on the shield when assembled in the casing tends to confirm the locking of the electrostatic shield 14 to the core housing 10.

The flexible skirt portion 15 advantageously also provides a centering effect to centre the shield around the casing radially inner wall portion. The centering effect and even distribution of potting material in the space 9 between the shield and casing ensures a homogeneous and reliable electrical behavior of the region between the shield and primary conductor, thus leading to reliable and predictable control of partial discharges that may occur between the primary conductor and the shield. The precise positioning of the shield relative to the magnetic core and winding assembly also helps to ensure the accuracy and reliability of the electrical behavior of the transducer.

The electrostatic shield 14 further comprises a grounding terminal 23 that may advantageously, in an embodiment, integrally extend from an edge of the shield for easy connection to a grounding circuit trace on the circuit board 12.

Advantages of the invention include, inter alia:

- economical manufacturing, for instance due only one very thin and light plastic part for the core housing, no slider in the mold, no adhesive tape needed.
- protection against the magnetic core sharp edges of the enameled copper wire while winding
- fast and simple assembly by clipping the core housing on the magnetic core
- minimized copper quantity for the winding due to optimized section to be wound and the few (in a preferred embodiment only two) coil support portions on the core housing
- despite its coarse geometry, the magnetic core is perfectly positioned in the core housing
- homogeneous winding control thanks to winding wire anti-slip elements
- specific shapes enable to guide and protect winding wire all along the different process steps.
- magnetic core housing enables to put in reference precisely the magnetic core, circuit board and magnetic field detector ASIC
- flexible skirt on the shield enables to position more precisely electrostatic screen around primary hole of the casing and to ensure even potting material filling between the shield and housing.

What is claimed is:

1. An electrical current transducer including a magnetic core comprising a magnetic circuit gap, a magnetic field detector comprising a sensing portion positioned in the magnetic circuit gap, a core housing comprising a coil support portion and a coil terminal connection portion, and a secondary coil formed from a wire wound around the coil support portion, wherein the coil support portion has a U-shaped cross-sectional profile comprising a base wall, a radially inner wall extending from the base wall and a radially outer wall extending from the base wall, the radially inner and outer walls having a height configured such that open end edges thereof extend slightly beyond an axial thickness of the magnetic core including any manufacturing tolerances such that the open end edges are folded inwards around corners of the magnetic core by the secondary coil wound around the core housing.

2. The current transducer according to claim 1, wherein the coil support portion comprises core latching elements in the form of latching shoulders configured to allow the magnetic core to be axially inserted in the core housing and to hold the core within the core housing during assembly.

3. The current transducer according to claim 2, wherein the base wall comprises orifices.

4. The current transducer according to claim 1, wherein the core housing further comprises at least one circuit board support portion mounted to the coil support portion, configured to provide a support leg for mounting of the magnetic core and the secondary coil on a circuit board.

5. The current transducer according to claim 1, wherein the coil support portion of the core housing comprises wire anti-slip elements configured to prevent slipping of a first winding layer of the secondary coil on the core housing during the winding process.

6. The current transducer according to claim 5, wherein the wire anti-slip elements comprise indents formed on an open end edge of the radially outer wall and/or radially inner wall.

7. The current transducer according to claim 1, wherein the coil terminal connection portion comprises a housing portion comprising a radially inner wall portion, a radially outer wall portion, a coil side wall portion and a coil side wall portion (36d), the coil side wall portions comprising deflector ribs arranged in a corner joining the side wall portions to the base wall, the deflector ribs configured to avoid a build-up of windings adjacent the side wall portions.

8. The current transducer according to claim 1, wherein the coil terminal connection portion comprises a magnetic sensor receiving cavity for lodging the magnetic field detector therein.

9. The current transducer according to claim 1, wherein the coil terminal connection portion comprises a circuit board resting edge and a circuit board latching element that extends over an edge of a circuit board to secure the magnetic core, the core housing and the secondary coil to the circuit board.

10. The current transducer according to claim 1, wherein the coil terminal connection portion comprises a first wire securing slot in the core housing receiving a first connection end of a wire forming the secondary coil, and a second wire securing slot receiving a second connection end of the wire.

11. The current transducer according to claim 1, wherein the core housing further comprises at least one circuit board support portion connected to the coil support portion, the circuit board support portion comprising a circuit board resting edge and a circuit board latching element configured to extend over an edge of a circuit board to secure the magnetic core, the core housing and the secondary coil to the circuit board.

12. The current transducer according to claim 11, wherein there is a single circuit board support portion, the circuit board support portion positioned opposite the coil terminal connection portion such that a mounting support of the magnetic core and the secondary coil is substantially balanced.

13. The current transducer according to claim 11, wherein the circuit board support portion comprises a housing portion comprising a radially inner wall portion, a radially outer wall portion, and coil side wall portions, the side wall portions comprising deflector ribs arranged in a corner joining the side wall portions to the base wall, the deflector ribs configured to avoid a build-up of windings adjacent the side wall portions.

14. The current transducer according to claim 1, wherein the core housing further comprises screen fixing protrusions configured to position and hold an electrostatic shield to the core housing during manufacturing assembly.

15. The current transducer according to claim 1, wherein the core housing is a single molded part.

* * * * *